United States Patent [19]
Devoe et al.

[11] Patent Number: 6,011,684
[45] Date of Patent: Jan. 4, 2000

[54] MONOLITHIC INTEGRATED MULTIPLE ELECTRONIC COMPONENTS INTERNALLY INTERCONNECTED AND EXTERNALLY CONNECTED BY CONDUCTIVE SIDE CASTELLATIONS TO THE MONOLITH THAT ARE OF VARYING WIDTH PARTICULARLY MONOLITHIC MULTIPLE CAPACITORS

[76] Inventors: Alan D. Devoe, 5715 Waverly, La Jolla, Calif. 92037; Lambert T. Devoe, 28213 Via Luis, Laguna Niguel, Va. 92677

[21] Appl. No.: 09/059,742

[22] Filed: Apr. 14, 1998

Related U.S. Application Data

[63] Continuation-in-part of application No. 08/528,856, Sep. 15, 1995, Pat. No. 5,657,199, application No. 08/528,855, Sep. 15, 1995, Pat. No. 5,625,528, and application No. 08/528,885, Sep. 15, 1995, Pat. No. 5,741,010, each is a division of application No.08/342,595, Nov. 21, 1994, abandoned, which is a division of application No. 07/964,150, Oct. 21, 1992, Pat. No. 5,367,430.

[51] Int. Cl.$^7$ .................................................. H01G 4/38
[52] U.S. Cl. ..................... 361/321.1; 361/328; 361/329
[58] Field of Search ............................ 361/303, 302, 361/306.1, 306.3, 307, 313, 321.2, 321.1, 321.3, 321.4, 321.5, 328, 329, 309, 330; 29/25.42, 25.41

*Primary Examiner*—Kristine Kincaid
*Assistant Examiner*—Anthony Dinkins
*Attorney, Agent, or Firm*—Fuess & Davidenas

[57] ABSTRACT

Variable width electrically conductive (i) traces and (ii) pads in the forms of castellations and connecting traces upon the surfaces of volume microminiature electronic components permit variable area electrical interconnection in three dimensions, particularly of monolithic, buried-substrate, multiple ceramic capacitors to integrated circuit receivers and amplifiers to make microminiature hearing aids insertable within the ear canal. A preferred embodiment monolithic multiple capacitor with side, top and bottom surfaces has a number of electrically conductive parallel layers disposed within its body with a conductive trace extending from each layer to be exposed upon a side surface. Metallized bus strips of at least two widths extend along the side surface; relatively thinner bus strips selectively interconnecting the exposed traces to form a plurality of capacitors while the relatively thicker bus strips selectively extend at least some traces to one or more edge(s) of the top and/or bottom surfaces of the body where they may be externally connected, normally to piggy-backed components, by reflow soldering. The different-width metallized bus strips are preferably made by rectangular saw-cut slots in the body at differently spaced intervals, the rectangular saw-cuts forming castellations having a greater depth than width to reduce parasitic capacitance.

8 Claims, 2 Drawing Sheets

MONOLITHIC INTEGRATED MULTIPLE ELECTRONIC COMPONENTS INTERNALLY INTERCONNECTED AND EXTERNALLY CONNECTED BY CONDUCTIVE SIDE CASTELLATIONS TO THE MONOLITH THAT ARE OF VARYING WIDTH PARTICULARLY MONOLITHIC MULTIPLE CAPACITORS

RELATION TO THE RELATED PATENT APPLICATIONS

The present patent application is a continuation-in-part of U.S. patent applications Ser. Nos. (i) 08/528,856 filed on Sep. 15, 1995, for CLOSE PHYSICAL MOUNTING OF LEADED AMPLIFIER/RECEIVERS TO THROUGH HOLES IN MONOLITHIC, BURIED-SUBSTRATE, MULTIPLE CAPACITORS SIMULTANEOUS WITH ELECTRICAL CONNECTION TO DUAL CAPACITORS OTHERWISE TRANSPIRING, PARTICULARLY FOR HEARING AID FILTERS issued Aug. 12, 1997, as U.S. Pat. No. 5,657,199, (ii) 08/528,855 filed on Sep. 15, 1995 for a MONOLITHIC, BURIED-SUBSTRATE, CERAMIC MULTIPLE CAPACITORS ISOLATED, ONE TO THE NEXT, BY DUAL-DIELECTRIC-CONSTANT, THREE-LAYER-LAMINATE ISOLATION LAYERS issued Apr. 29, 1997, as U.S. Pat. No. 5,625,528, and (iii) 08/528,885 filed on Sep. 15, 1995, for PRINTING AND ADHERING PATTERNED METAL ON A LAID-UP MULTI-LAYER GREEN WAFER BEFORE FIRING SO AS TO LATER FORM PRECISE INTEGRAL CO-FIRED CONDUCTIVE TRACES AND PADS ON SELECTED TOP AND BOTTOM SURFACES OF MONOLITHIC, BURIED-SUBSTRATE, CERAMIC MULTIPLE CAPACITORS DICED FROM THE WAFER, INCLUDING PADS SUPPORTING SURFACE MOUNTING AND/OR MOUNTING IN TIERS issued Apr. 14, 1998, as U.S. Pat. No. 5,741,010.

All three predecessor applications are themselves divisionals of U.S. patent application Ser. Nos. 08/342,595 filed on Nov. 21, 1994, now abandoned for a MONOLITHIC MULTIPLE CAPACITOR to inventors Alan D. Devoe and Daniel F. Devoe, which application is a divisional of predecessor U.S. patent application 07/964,150 filed on Oct. 21, 1992 for a MONOLITHIC MULTIPLE CAPACITOR to inventors Alan D. Devoe and Daniel F. Devoe, a patent on which application issued on Nov. 24, 1994, as U.S. Pat. No. 5,367,430.

The present application is to the same Alan D. Devoe who is a co-inventor on the three related predecessor patent applications, and the predecessor patent.

The contents of all related predecessor patent applications and patents are incorporated herein by reference.

BACKGROUND OF THE INVENTION

1. Field of the Invention

The present invention generally concerns the provision of electrically conductive (i) traces and (ii) pads on microminiature electronic components assembled and integrated in three-dimensional, monolithic form. Such monolithic multiple electronic components particularly include, but are not limited to, monolithic, buried-substrate, multiple ceramic capacitors (sometimes called "ceramic multiple capacitors").

The present invention more particularly concerns a way (i) in which electrical interconnection internal to the monolith may be made between the multiple electronic components of the monolith, and, also, (ii) by which external electrical connection to the monolith itself (and to selected electronic components therein) may be made. For example, the present invention particularly concerns multi-path electrical interconnections between, and external electrical connections to, (i) each of the multiple capacitors that are within a monolithic, buried-substrate, multiple ceramic capacitor and, also (ii) one or more electronic circuit components, namely: integrated circuit receivers and amplifiers that are usefully connected to and packaged compactly with, and externally to, the monolithic multiple capacitor.

Thus, to state again, the present invention concerns both internal and external electrical connections that re respectively within, and to, a monolithic, three-dimensional, electrical component.

The present invention still more particularly concerns a process of accurately making both (i) narrow conductive traces, and also (ii) integral wide conductive pads, on the multiple surfaces of a monolithic multiple electronic component, and the monolithic component so made. The multiple electronic component may again particularly be a buried-substrate multiple ceramic capacitor simultaneously that has and presents both (i) narrow traces for multi-path electrical connection to each of several capacitors that are within the multiple capacitor, and (ii) broad pads are suitable for reliable external electrical connection including by surface mounting. The external electrical connections may particularly be to one or more integrated electronic receivers and amplifiers that are used, when physically mounted and electrically connected together with the multiple capacitor, as microminiature hearing aids inserted in the external acoustic meatus, or ear canal.

2. Description of the Prior Art

2.1 The Structure of Monolithic Multiple Buried-Substrate Capacitors

A monolithic buried-substrate, or multiple buried-substrate, multiple capacitor is sometimes identified with the two words "substrate" and "capacitor" reversed, and is sometimes called a Buried Capacitor Substrate, or BCS. Howsoever called, BCSs accord significant size reduction to microelectronic applications. A BCS integrates capacitors, resistors and traces together into a thin, multi-layer, monolith which can be joined with integrated circuit ("IC") devices. Volumetric reductions over individual "chip" capacitor and/or resistor components of 50% to 75% are possible because the BCS both eliminates the air gaps between passive components and replaces the alumina substrate of traditional hybrids.

A BCS accords the freedom to mount one or more ICs directly onto itself (or perhaps even one on each side). The composite device so formed can then be attached to a ribbon lead, a larger hybrid, or a Multi Chip Module. The BCS is also compatible with flip chip IC designs, giving the most dense hybrids presently possible, circa 1995.

Substrate density and management of parasitic capacitances are the technological keys to BCS miniaturization. A BCS desirably uses the finest possible spacing for electrical connections around its edges (typically 0.020"), thus offering the greatest number of connections between an IC and the multiple capacitors that are buried within the BCS. Stray capacitance between these connections is preferably controlled by the unique castellation forming technique taught in the related U.S. Pat. No. 5,367,430 for a MONOLITHIC MULTIPLE CAPACITOR. Inside the BCS, multi-layer technologies are used. Stray capacitance between these layers is preferably controlled by the use of high and low K dielectrics in combination, as is taught in U.S. Pat. No. 4,419,714 to Locke. These techniques combine to maintain parasitic capacitance at low levels, and to give low coupled noise, between internal capacitors.

Conductive traces and/or pads are typically placed only upon a "top", and sometimes also a "bottom", surface of the BCS. These conductive traces and/or pads are the basis by which electrical connections to the BCS are made have. They have previously been formed by printing, particularly by screen printing and more particularly by silk screening.

Electrical connection to these various top and/or bottom surface printed conductive traces and pads can be made by soldering, various types of wire bonding, and/or flip-chip die attach. The BCS itself can be attached by soldering to either a larger hybrid, a Multi Chip Module, or a flexible ribbon cable. IC's and discrete components can be attached at one or another surfaces of the BCS. The conductive surface traces and pads are typically printed as 5 mil lines with 5 mil spacing, and in any pattern required to fit the application.

Electrical connection between the capacitors buried within the BCS and the printed circuit traces and pads upon its top and/or bottom surfaces are preferably made as a series of castellations along one or more sides of the BCS. The series of castellations provide selective electrical connection from the plates of capacitors within the body of the BCS to particular conductive traces and pads the top and/or bottom surfaces of the BCS. The castellations consist of metallized pads separated by 6 to 12 mil deep air gaps. A pitch 0.020 inches between castellations is possible while still retaining excellent solder reflow characteristics. These castellations are, again, the subject of related U.S. Pat. No. 5,367,430 for a MONOLITHIC MULTIPLE CAPACITOR.

A soldered connection to a castellation can provide a variety of electrical connections: 1) directly to the IC; 2) through a passive component and then to the IC; or 3) to the IC with a capacitor shunt to ground. In cases where an IC on each side of the BCS requires many I/O connections, a series of castellations can be made with 5 mil pads and 5 mil spaces.

BCS can be produced in a variety of sizes. A typical minimum size is 0.070 by 0.070 inches. The size of a BCS will usually be chosen based on capacitance values desired, the voltage rating, and internal space needed to control stray capacitance. Any sizes up to 1" by 1" and larger are possible, with maximum capacitance values near 10 $\mu f$. Again, the actual capacitance value achieved depends on the voltage rating required.

Because a BCS contain non-symmetric buried plates, variation in surface flatness can be expected. Production techniques allow three controls of this irregularity. A BCS can be made so that the top surface is flat and the bottom surface contains all the irregularity. A BCS can be made so that the bottom surface is flat and the top surface contains all the irregularity. Finally, a BCS can be made so that the irregularity is averaged on both sides, so that it is equally absorbed by the top and bottom surfaces.

Internal conductor traces can be used to connect castellations on side surface of the BCS to castellations upon another side surface of the BCS. Usually this is needed when internal capacitor arrangements make conventional layouts impossible, or to accommodate existing IC pad locations. The layer of connective traces can be put in at any level within the BCS, depending on what is optimal for reducing stray capacitance.

Various designs of the internal plates of each buried capacitor within a BCS are possible. Capacitance value depends on the active area of each capacitor and the number of layers used.

It is possible to design one or more capacitors adjacent to an internal ground plane. By changing the position of connecting tabs, almost any connection configuration can be achieved.

Shielded capacitors are created by having a series of capacitor plates which are surrounded by two ground planes. This shielding can occur above and below the capacitor or along the edge of the BCS.

Coupling capacitors can be designed using a stack of individual opposing plates. Again, capacitance value depends on the number of layers and the active area of each chip.

In a typical BCS, capacitors are stacked in different levels within the BCS; one or more capacitors are built on each level, and each capacitor tabs out to a different castellation. Typically one castellation will connect to all internal ground planes.

Stray capacitance between different internal capacitors within the BCS is controlled by varying the distance between the capacitors on the same level or by varying the layer thickness between levels.

BESS are commonly made from any of NPO, X7R, and Z5U dielectrics. For ease of designing a substrate, the dielectrics can be thought of as capacitance achieved per unit area, given a normalized dielectric thickness.

For an area 0.1 inches on a side, at a dielectric thickness of 0.001 inches, typical BCS capacitance values are as follows:

| Dielectric | Capacitance per .01 inch square @ 1.0 mil thick |
| --- | --- |
| NPO | 312.7 pF |
| X7R | 7417 pF |
| ZSU | 6,477 pF |

2.2 The Use of, and the Previous Electrical Connection to, Monolithic Multiple Buried-Substrate Capacitors Monolithic multiple buried-substrate capacitors—sometimes call BCS as in the previous subsection—contain, just as their name indicates, multiple capacitors within a single, monolithic, body. Monolithic multiple buried-substrate capacitors are typically electrically connected to, and useful in combination with, small, integrated, electronic devices, particularly including the amplifiers and receivers of hearing aids that are inserted in the external acoustic meatus, or ear canal. The substantial purpose of putting multiple buried-substrate capacitors within a single monolith is to save volume; otherwise a number of separate conventional "chip" capacitors could be conventionally employed.

The difficulty of making electrical connections to multiple buried-substrate capacitors are, however, multiplied by the number of such separate connections to be made. The difficulty of electrical connection is further aggravated by the typical microminiature size of a multiple buried-substrate capacitor—which is typically as small as 0.070"×0.070"×0.020" thickness—and by the commensurate microminiature size of the electronic devices (e.g., Ics) to which the multiple capacitor is connected.

The connected electronic devices—IC amplifiers and receivers and the like requiring connection to external capacitors for filtering purposes—are typically provided with leads.

It has been suggested to place holes, or bores, in the body of a multiple buried-substrate capacitor—including by process of laser drilling—and to then place the leads in the bores, thus attempting to make down-hole electrical connection with selected electrodes of the buried capacitors. This effort has essentially come to naught. In the first place, the hole placement, by laser drilling or otherwise, tends to displace the conductive material of the electrodes that are penetrated by the drilling down hole, leaving an insufficient amount of this conductive material at the walls of the bores at (and only at) the regions of the exposed down-hole electrodes so as to permit electrical connection to be reliably made to the electrodes. Moreover, and equally importantly, it is all but impossible to wick solder into the typically small drilled holes. Finally, any access to these holes is likely—should an electronic device (an IC) be mounted flush to the multiple capacitor as is commonly desired—severely impeded.

Accordingly, the typical previous electrical connection of leaded electronic devices—IC amplifiers and receivers and the like—to the several capacitors that are within the body of a multiple buried-substrate capacitor has been by (i) bringing the electrodes of the capacitors to some localized, pad, region on a surface of the multiple buried-substrate capacitor, and then (ii) hand soldering the leads of the electronic devices to these pads.

To say that this hand soldering work is delicate and painstaking, and therefore expensive, is an understatement. It is typically performed by dexterous women viewing their soldering operations though microscopes. Present difficulties in electrically connecting one microminiature component to another is one reason that very, very small electronic items such as hearing aids that fit within the external acoustic meatus, or ear canal tend to be expensive, costing several hundreds and even thousands of dollars U.S. circa 1995.

The previous manner of constructing the pad regions at the top surface of a multiple buried-substrate capacitor is itself quite intricate. The multiple buried substrate capacitor is, as previously explained, comprised of a number of patterned layers which constitute the plates and the intervening insulating layers of multiple capacitors. The plate layers are selectively brought to a side surface of the multiple buried-substrate capacitor, and are then commonly (although not necessarily) brought to the top surface of the multiple buried-substrate capacitor by various means.

In U.S. Pat. No. 4,419,714 for a LOW INDUCTANCE CERAMIC CAPACITOR AND METHOD FOR ITS MAKING issued Dec. 6, 1983, external connections are brought out to bus bars. These bus bars may be connected externally to select desired values of capacitance for a particular circuit. The bus bars also represent a common face. Solder balls are confined by a mask, or solder dam, that is made of a material that will not wet (i.e., stick to the solder ball). These solder balls are placed on the common face, and upon the bus bars, to facilitate soldered external electrical connection of the multiple buried-substrate capacitors to an external circuit. The mask is placed by conventional masking and etching techniques, preferably by the well-known lift-off process as defined in U.S. Pat. No. 4,004,044 to Franco, et al.

Notably, all this patterning is not part of production of the multilayered construction of the multiple buried-substrate capacitor itself. The multiple buried-substrate capacitor is produced by stacking multiple, normally some thirty to one hundred and more (30–100+) sheets, normally of the order of three inches to five inches square (3–5 in$^2$), of ceramic material. These sheets are selectively patterned with conductive ink by process of printing. The composite assembly is compressed and heated to drive off an organic binder and sinter, or fuse, the powdered ceramic layers into a monolithic structure. All the external electrical connection(s), and particularly the patterned solder mask, are thus made after the structure has been sintered, or fused.

The essential difference as to when this patterning operation is done is simple. During the assembly process, what will become each individual multiple buried-substrate capacitor is typically arrayed with a very great number, typically 800+, typically identical multiple capacitors. All are printed at once. Once an individual multiple capacitor is sawed away—as it must be in order to place and side-surface conductive bus bars—then any printing or patterning on any surface of the multiple capacitor must be performed for on that multiple capacitor alone. Because each multiple capacitor is very small, its registration for patterning, and its subsequent patterning, are each very difficult.

In the U.S. Pat. No. 4,430,690 for a LOW INDUCTANCE MLC CAPACITOR WITH METAL IMPREGNATION AND SOLDER BAR CONTACT issued Feb. 7, 1984 ("MLC" is defined in the patent to mean "multilayered ceramic"), external connections are themselves selectively soldered to a plurality of solder bars to mount the capacitor(s) to a circuit board—as opposed to the solder bars themselves being selectively electrically connected.

Finally, in the related U.S. Pat. No. 5,367,430 for a MONOLITHIC MULTIPLE CAPACITOR a series of castellations along the side(s) of a multiple capacitor (which is the same as, and which is sometimes called, a Buried Capacitor Substrate, or BCS) serve to provide electrical connection from capacitors within the body of the multiple capacitor to conductive traces and pads on the top and/or bottom surfaces of the multiple capacitor. These castellations are established by saw-cutting slots in cured conductive ink. The conductive ink traces (as are separated by the saw-cut slots) terminate by "rolling over" for a slight distance onto the top and bottom surfaces of the multiple capacitor. Although the minute top and bottom surface edge regions where the conductive ink has "rolled over" the edge exhibit excellent solder characteristics, these minute and localized regions are distinctly (i) near the edges of the top and bottom surfaces of the multiple capacitor, only, (ii) are undesirably small, and, as such, (iii) are themselves and without more totally unadaptable to forming some arbitrary pattern of pads at which, and to which, some external component or circuit having a predetermined lead pattern may be connected.

According to the need to extend the minute and localized "roll over" regions of the conductive ink that is upon the sides of the multiple capacitor to the further, non-edge, regions of the top and/or bottom surfaces of the multiple capacitor, the related patent teaches the expansion and extension of these edge regions to other, further areas, by the patterning of conductive traces. These conductive traces were patterned and placed on a top (an/or a bottom) surface of the multiple capacitor by printing, normally by screen printing or a like process.

This patterned printing must be done after the conductive ink (if not also the saw-cut slots defining the castellations) is already upon the multiple capacitor, meaning that the multiple capacitor must have been separated (by sawing) from the many, many others (typically 800+ such identical others) with which it was manufactured. The printing is accordingly at a small scale on a work piece multiple capacitor of small size, and is both exacting and difficult.

Accordingly, all the prior art of which the inventors are aware, including their own related patent, teach of the electrical connection, and the selective connection, of the capacitors that are within a multiple buried-substrate capacitor by at least some electrical paths that are, at least in part, printed or otherwise patterned on a (commonly, top) surface of an individual multiple buried-substrate capacitor. This printing and patterning must be done after, and as a separate process from, the original production of the multiple buried-substrate capacitor as was performed by processes of stacking, and of selectively printing, multiple layers, and of sintering the multi-layer structure so formed. Accordingly, this printing has universally been done one microminiature multiple buried-substrate capacitor at a time—instead of the 800+ that are commonly built at once—in a fixture, and with yield losses that are commensurate with the intricacy of the task.

The printing is and patterning is normally with silver metal as opposed to, for example, gold or a metal from the platinum group, normally platinum of palladium. This is because of cost; silver offering the best electrical conductivity per unit cost.

2.3 Small Electrical Components Can Be Efficiently and Reliably Electrically Connected by Reflow Soldering, Including by Automation, And the Electrical Connection of Such Small Components to Monolithic Multiple Buried-Substrate Capacitors is Taught in a Related Predecessor Patent Application Reliable and efficient electrical connection of small things may be realized by reflow soldering. Many electrical components from microminiature, chip, capacitors to multi-terminal integrated circuit flat packs are connected to printed circuit boards by this technique.

The related predecessor patent application Ser. No. 08/528,885 teaches the (i) printing and adhering patterned metal on the top and/or bottom surfaces of a multi-layer laid-up green ceramic wafers containing a typically large array of ceramic multiple capacitors, normally 800+ such capacitors, the (ii) dicing the wafer into ceramic multiple capacitors each of which has patterned surface metal, and the (ii) co-firing the ceramic multiple capacitors each with its patterned surface metal to produce conductive traces and pads on the top and/or bottom surfaces of the ceramic multiple capacitors.

The traces so created particularly support that electrical connection should be made to (later-formed) conductive traces, and conductive castellations, on the sides of the multiple capacitor (as such conductive castellations are taught in related predecessor U.S. Pat. No. 5,367,430), and through these conductive traces and castellations to the electrodes of buried-substrate capacitors that are located within the ceramic multiple capacitor.

The pads so created are typically arrayed in a "pin-grid" pattern. The pads support (i) surface mounting of the ceramic multiple capacitor (normally at its "bottom" surface), and also (ii) surface mounting of other electronic components, particularly including integrated circuit amplifiers and receivers, to the ceramic multiple capacitor (normally at and upon its "top" surface). Multiple electrical components may be mounted and electrically interconnected in tiers in three dimensions to the pads of the ceramic multiple capacitor at high density of both (i) physical components and (ii) electrical paths.

The printing typically transpires by silkscreening, normally upon a laid-up multi-layer green ceramic wafer that is highly accurately registered in position. The typical wafer is laid-up in patterned layers, typically 16+ such layers, of ceramic dielectric and metallization. A typical wafer is four inches 4" in diameter and contains 800+ separate devices each of which will ultimately become a ceramic multiple capacitor. Each ceramic multiple capacitor is itself a monolithic microminiature device that typically contains some 8+ buried-substrate capacitors.

The patterned metal is preferably a noble metal, more preferably gold or a member of the platinum group, and more particularly palladium or platinum. The patterned metal must in any case be able to maintain pattern integrity during the high temperatures of firing. Silver, as is commonly used to print conductive pads on diced and fired substrates in the prior art, is thus excluded.

The adhering of this metal is preferably by a glass frit that is chosen based on the temperature of firing. The preferred glass frit is suitable for a temperature range from 1000° C. to 1400° C.

Several advantages are realized.

First, only one printing operation needs be done (per major surface) on an entire water—instead of one printing conductive traces on each of the multitudinous individual multiple ceramic capacitors, one or a few at a time, after dicing and firing. Registration, and generally also patterning, accuracy is improved simultaneously that the alignment task is made much easier.

Second, the co-fired metal creates integral, durable, and precisely located traces and pads of uniform thickness and good quality.

Third, the wafer may be, and normally is, patterned on both its top and bottom surfaces, thus ultimately serving to make conductive traces and pads on both the top and the bottom surfaces of the ceramic multiple capacitors. The conductive traces commonly extend to the edges of the top and bottom surfaces where they are readily wetted by such side-surface solder lands as ultimately electrically connect to buried capacitors. Particularly when this side-surface solder is contained and channeled in closely spaced parallel castellations upon up to all four sides of a ceramic multiple capacitor—as is taught in related U.S. Pat. No. 5,367,430—very dense and numerous connections can be made. Six or more (6+) separate capacitors may typically be connected, and interconnected, in a monolithic multiple ceramic capacitor having dimensions as small as 0.070"×0.070"×0.020".

Meanwhile, those pads (which pads are normally at one terminus of the traces) that are commonly located on the "bottom" surface of the multiple ceramic capacitor permit and support precision surface mounting. The surface mounting may be by any of adhering with conductive adhesive, soldering, reflow soldering, gold wire bonding, aluminum wire bonding, flip-chip mounting, or die bonding, and is most commonly by use of conductive adhesives or solder. The surface mounting is may be to any of a printed circuit board, a flexible substrate, an alumina substrate, a multi-chip module, an electrical circuit, or another electrical component.

Less obvious than is the use of the bottom pads of the ceramic multiple capacitor for surface mounting, additional pads that are commonly located on the "top" surface of the multiple ceramic capacitor permit and support the mounting—including surface mounting again by use of both conductive adhesives and solder—of still other (generally microminiature) circuits and components to the multiple ceramic capacitor.

A complex physical and electrical interconnection in multiple "tiers" in three-dimensions may thus be created by essentially using the ceramic multiple capacitor, with its multiple dense connective pads and paths, as the "bedrock", or "glue" for all. Consider that a multiple ceramic capacitor is a commonly usefully connected to, and between, many other physically separate components in complex electronic assemblies, such as hearing aids. See, for example, the related predecessor patent application Ser. No. 08/528,856 now U.S. Pat. No. 5,657,199 for CLOSE PHYSICAL MOUNTING OF LEADED AMPLIFIER/RECEIVERS TO THROUGH HOLES IN MONOLITHIC, BURIED-SUBSTRATE, MULTIPLE CAPACITORS SIMULTANEOUS WITH ELECTRICAL CONNECTION TO DUAL CAPACITORS OTHERWISE TRANSPIRING, PARTICULARLY FOR HEARING AID FILTERS.

SUMMARY OF THE INVENTION

The present invention contemplates variable width electrically conductive (i) traces and (ii) pads—as are capable of greater and lessor densities and as do handle lessor and greater current flows—of a certain particular type—to wit: side surface castellations and connecting traces created in three dimensions—located upon volume microminiature electronic components that are assembled and integrated together in three-dimensional, monolithic form. In simplistic terms, the present invention deals with variable area electrical interconnection in three dimensions in an manner analogous to the use of variable width traces and pads upon a two-dimensional printed circuit board.

Before explaining exactly what the three-dimensional connections are, it is noted that volume, or monolithic, multiple microminiature electronic components typically include, but are not limited to, (i) monolithic, buried-substrate, multiple ceramic capacitors (sometimes called "ceramic multiple capacitors") and (ii) other selected electronic components such as, inter alia, ceramic resistors and inductors and integrated circuit receivers and amplifiers, that are usefully connected to these multiple ceramic capacitors. The three-dimensional interconnection provided by the present invention permits such components to be assembled into, by way of example, microminiature hearing aids that are completely inserted in the external acoustic meatus, or ear canal.

The present invention is preferably embodied both (i) within, and (ii) at the surfaces of, a monolithic (i.e., volume-occupying, or three-dimensional) multiple electronic component. The component has a three-dimensional body with a length, and exterior side and top surfaces. A multiplicity of electronic components are disposed within this body—making thus a "multiple electronic component".

Like as to the scheme of the related patent applications, a number of electrically-conductive traces are disposed within the body in layers along the length of the body. These many traces electrically connect to the multiplicity of electronic components within the body. At least some of the many traces that are upon at least some of the layers extend to present a connectable trace-edge at at least one side surface of the body.

Particular to the scheme of the present invention, a plurality of electrically-conductive bus strips having at least two—a relatively thinner and a relatively thicker—widths, electrically connect to the trace-edges. The relatively thinner bus strips extend along at least one side surface of the body so as to selectively electrically interconnect selected connectable trace-edges to selected other connectable trace-edges, therein internally electrically interconnecting selected ones of the multiple components. Meanwhile, the relatively thicker bus strips extend along at least one side surface of the body from selected connectable trace-edges to, and so far as to, an edge of at least one of the top and bottom surfaces of the body. At these edge locations each relatively thicker bus strip is suitably reliably selectively electrically externally connected, therein permitting reliable external electrically connection to selective ones of the multiple components that are within the body.

By this construction three advantages are realized. First, the relatively thinner bus strips—by which electrical interconnection of selected ones of the multiple components that are within the body transpires—(1) conserve room upon the side surfaces of the body. This means that more connections can be made per unit area. Second, and meanwhile, the relatively thicker bus strips are adequately wide and robust so as to, in particular, both (2a) exhibit superior mechanical resistance to chipping when located, as is preferable, at the edges of the sides of body, while (2b) permitting reliable external electrical connection to themselves, and also to the selected ones of the multiple components to which they are in turn connected, at, in accordance with their increased size, a lower ohmic resistance. Finally, and as is related to advantage (2a), the wider thicker bus strips mate admirably fully with equally large solder pads that are located on the top and bottom surfaces of the body. These large solder pads, matched to the large bus strips, permit easy, positionally tolerance, high current, low resistance connections.

Therefore the present invention is beyond merely making things—in this case bus strips, or side castellations—larger or smaller as the situation requires, but is more of an integrated approach to simultaneously regionally realizing both desirable mechanical and electrical properties. In short, each of (i) internal, and (ii) external, three-dimensional electrical connection (and interconnection) problems of a monolithic, three-dimensional, electrical/electronic component are solved in a compact, volume-conserving, manner.

The electrically-conductive layer upon at least one of the top and the bottom surfaces of the body may be, and preferably is, patterned. The patterning of this layer serves to selectively electrically connect strip-edges of the relatively thicker strips appearing at the at least one top and bottom surface of the body to reflow solder pads upon this at least one surface of the body. The thick (relatively larger) strips connect to large (relatively larger) pads. The thin (relatively smaller) strips connect, if any do, to small (relatively smaller) pads. Miniaturized electrical connection may be reliably made to these reflow solder pads by reflow soldering.

The monolithic multiple electronic component is typically a ceramic multiple capacitor. In this case the three-dimensional body is primarily ceramics, and the multiple electronic components disposed within the body are simply a number of capacitors having electrically-conductive parallel layers disposed in the body and layered along the length thereof. In this application the relatively thinner bus strips extend along at least one side surface of the body where they serve to selectively electrically interconnect selected ones of the electrically-conductive parallel layers so as to form the multiplicity of capacitors. Meanwhile, the relatively thicker bus strips extend along at least one side surface of the body to electrically connect to the capacitors.

In fact, the patterned electrically-conductive top, and/or bottom, surface layer is preferably integral to the body. The patterning of this integral top and/or bottom surface layer serves to selectively electrically connect the external electrical connections appearing at the edges of top surface of the body, and the plurality of capacitors to which these external electrical connections in turn electrically connect, to reflow solder pads upon the top surface of the body. Electrical connection may reliably be made by reflow soldering.

This integral construction is realized when the patterned electrically-conductive top and/or bottom surface layer is integrally incorporated into the three-dimensional ceramic body at the same time as are the plurality of electrically-conductive parallel layers therein the body. This top and/or bottom surface layer is itself but an uppermost, outwardly-disposed and—exposed, particularly patterned, electrically conductive layer. It is fully as integral to the three-dimensional ceramic body as are the plurality of electrically-conductive parallel layers within the body.

In fact, both the patterned electrically-conductive top and bottom surface layers are preferably integral to the body, and jointly serve to selectively electrically connect the external electrical connections appearing at the edges of top surface of the body, and the plurality of capacitors to which these external electrical connections electrically connect, to reflow solder pads upon both top and the bottom surfaces of the body. The patterned electrically-conductive top and bottom surface layers are therefore integrally incorporated into the three-dimensional ceramic body at the same times as are the plurality of electrically-conductive parallel layers therein the body, and are themselves but uppermost and lowermost, outwardly-disposed and—exposed, particularly patterned, electrically conductive layers.

In actual, preferred, construction the electrically-conductive bus strips are implemented as castellations of at least two—a relatively thinner and a relatively thicker—widths.

So implemented, a monolithic multiple capacitor will clearly still have a ceramic body with a length, and side, top and bottom surfaces. A number of electrically conductive parallel layers are disposed in said body and layered along its length, each conductive layer having a trace extending to a side surface of said ceramic body. A number of metallized bus strips of at least two—a relatively thinner and a relatively thicker—widths extend along at least one side surface of said ceramic body.

The relatively thinner bus strips selectively interconnect at least some of the traces that extend to the at least one side surface to each other in order to form a plurality of capacitors. Meanwhile, the relatively thicker bus strips selectively extend at least some traces that extend to the at least one side surface to one or more edge(s) of at least one of the top and bottom surfaces of the body. At this (these) edge(s) the plurality of relatively thicker bus strips are suitably reflow soldered to form an plurality of external connections.

The metallized bus strips are created and defined by a number of saw-cut slots disposed in the body at at least two differently spaced intervals, therein making the metallized bus strips having the at least two widths. These saw-cut slots are typically rectangular in cross-section with a depth and a width, the depth of at least one of the rectangular saw-cut slots being greater than the width thereof in order to promote selective reduction of parasitic capacitance between adjacent external connections.

These and other aspects and attributes of the present invention will become increasingly clear upon reference to the following drawings and accompanying specification.

DESCRIPTION OF THE PREFERRED EMBODIMENT

1. General Embodiments of the Invention

Figure 1:
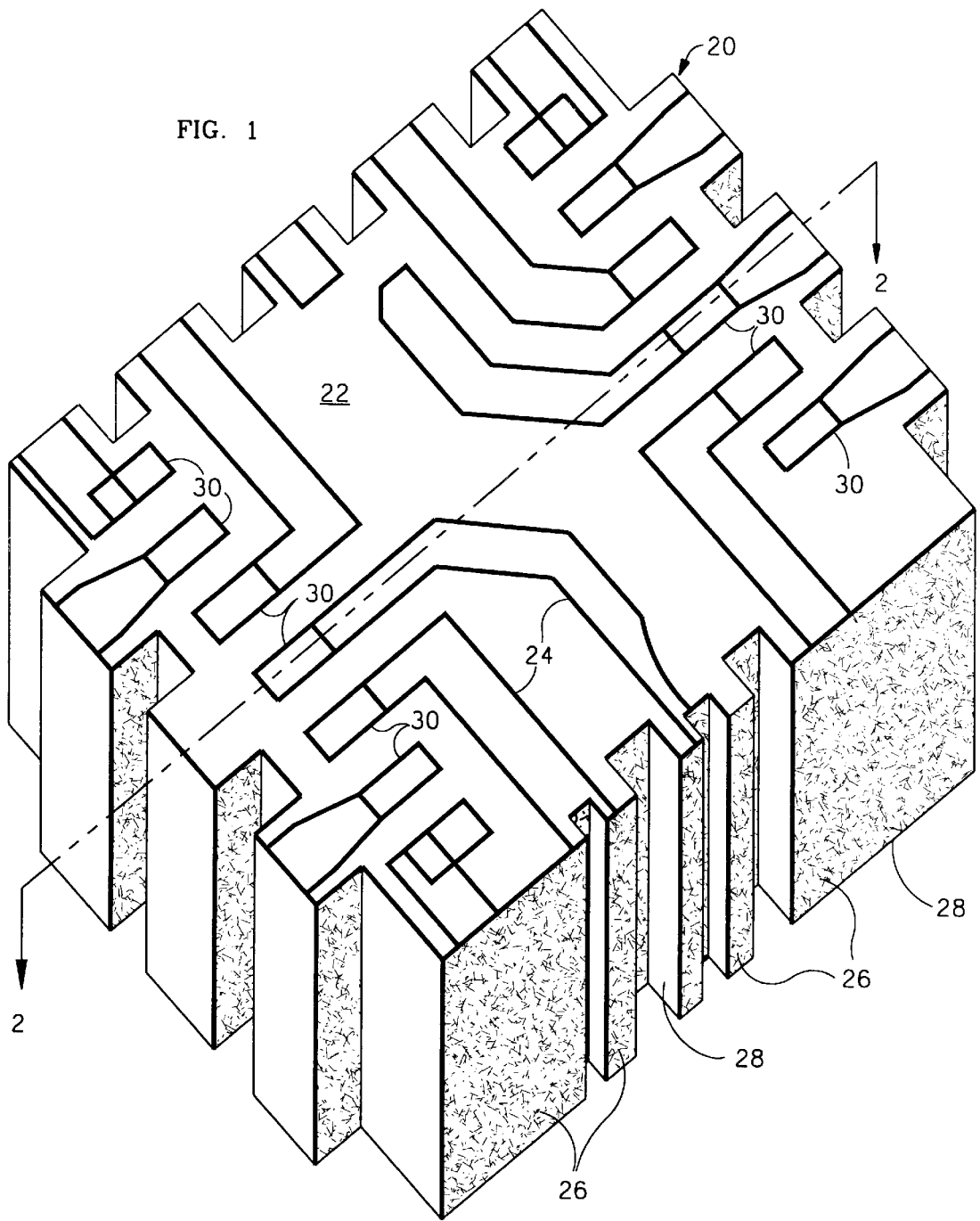
FIG. 1 is a diagrammatic perspective view showing a first embodiment of a monolithic, buried-substrate, ceramic multiple capacitor in accordance with the present invention having integral conduction traces on its top surface.

The present invention is embodied in a monolithic, buried-substrate, ceramic multiple capacitor having conduction traces—normally on its top and permissively also its bottom surfaces—that are integrally formed, meaning that the traces are formed as metallization layers that are co-fired, and sintered, along with all other electrically-insulating and -conductive layers of the ceramic multiple capacitor. The integrally formed, top and/or bottom surface, conduction traces are typically patterned so as to terminate in pads of ample area that are arrayed in a "pin-grid" pattern. These arrayed pads particularly support the stable locating, and the reliable electrical connection of, external electrical circuits and components by the process of reflow soldering.

The integrally formed conduction traces may particularly serve to selectively electrically connect (i) metallization patterns on the sides of the ceramic multiple capacitor, which metallization traces connect to such electrodes of buried-substrate capacitors as are selectively brought to the side surfaces of ceramic multiple capacitor, to (ii) arrayed pads on both the top and the bottom surfaces of the ceramic multiple capacitor. The bottom-surface pads, in particular, commonly support the surface mounting of the multiple capacitor to a patterned, printed circuit, substrate. The top-surface pads, in particular, commonly support the physical mounting and electrical connection of one or more circuits or components piggyback to, and on, the multiple capacitor, including in multi-tier, tower, arrangement.

The purposes of integral top and/or bottom patterned surfaces which are—both their metallurgy and in their layout—fully compliant with the best practices for surface mounting by conductive adhesive or reflow soldering are several.

The integrally patterned surfaces are efficiently formed, and are placed in the multiple capacitors while they are being fabricated in large arrays upon green ceramic wafer, and before any dicing or firing/sintering.

The integrally patterned surfaces particularly permit the close physical and electrical attachment of a microminiature integrated circuit (IC) receivers and/or amplifiers, particularly as may be used in hearing aids that are inserted in the external acoustic meatus, or ear canal.

The integral patterned surfaces permit the ready reflow soldering of the ceramic multiple capacitor to a patterned, printed circuit substrate, or, in turn, the ready flow soldering of other components to the capacitor—including by automated equipments.

Finally, hybrid (i) reflow soldered, and (ii) soldered wire, connections are simultaneously passible to the integrally patterned top and/or bottom surface traces, permitting realization of extremely dense multiple connection in minute volumes and areas. Typically features as small as 0.5 mil dimensions may be simultaneously solder-connected on all (six) sides of multiple capacitors that may themselves have dimensions that are only slightly greater.

The multiple capacitors so permitting dense connection may actually serve as an intermediary physical structure between (as well as providing plural capacitors that are electrically connected to) other system components, normally to integrated circuits (ICs). It may thus become possible to connect two or more ICs in a three-dimensional "stack", and in a very compact volume, by use of a multiple capacitor in accordance with the present invention as a sort of "glue". Because of the soldered connections, both mechanical stability and heat transfer and dissipation within the "stack" are fairly good.

One embodiment of the present invention is based on previous monolithic ceramic multiple capacitor having a three-dimensional ceramic body with a length, and exterior side and top surfaces, and also having a number of electrically-conductive parallel layers disposed in the body and layered along the length thereof. At least some of the layers have an edge connection extending to a side surface of the body. This previous capacitor also commonly has a number of electrically-conductive bus strips extending along the side surfaces of the body. The bus strips serve to selectively electrically interconnect to edges of the multiplicity of electrically-conductive parallel layers so as to form a plurality of capacitors. The bus strips and the edge connections jointly form a number of external electrical connections to the buried capacitors. These external electrical connections appear at the edges of the top, and bottom, surfaces of the body of the multiple capacitor.

To this previous structure of a multiple capacitor, the present invention adds a patterned, electrically-conductive, top surface layer that is integral to the body of the multiple capacitor. The patterning of this integral top surface layer typically serves to selectively electrically connect the external electrical connections appearing at the edges of top surface of the body, and thus the plurality of capacitors to which these external electrical connections electrically connect, to surface mounting pads located upon the top surface of the multiple capacitor's body. Electrical connection may suitably be made to these surface mounting pads by use of conductive adhesive, or by process of reflow soldering.

According to this construction, the patterned electrically-conductive top surface layer is integrally incorporated into the three-dimensional ceramic body at the same time as are all the other electrically-conductive, and electrically-insulating, parallel layers therein the body. The patterned electrically-conductive top surface layer is but an uppermost, outwardly-disposed and -exposed, particularly patterned, electrically conductive layer. This patterned electrically-conductive top surface layer is fully as integral to the three-dimensional ceramic body as are any of the plurality of electrically-conductive parallel layers deeper within the ceramic body.

An electrically-conductive bottom surface metallization layer may be equivalently patterned and co-fired, giving yet another surface, and other features, to which electrical connection may suitably be made by surface mounting.

The reflow solder pads permit electrical connection of the three-dimensional ceramic body of the monolithic ceramic multiple capacitor to a printed circuit substrate in a flip-chip configuration. They also permit an electrical connection of one or more electrical components that ride atop the three-dimensional ceramic body of the monolithic ceramic multiple capacitor, including in multi-tier tower.

Particularly in accordance with the present invention, the electrically-conductive bus strips have at least two—a relatively thinner and a relatively thicker—widths. The relatively thinner bus strips extend along at least one side surface of the body so as to selectively electrically interconnect selected connectable trace-edges to selected other connectable trace-edges, therein internally electrically interconnecting selected ones of the multiple components. Meanwhile, the relatively thicker bus strips extend along at least one side surface of the body from selected connectable trace-edges to, and so far as to, an edge of at least one of the top and bottom surfaces of the body. These thicker bus strips are normally, preferably, located at the side surface edges. At these edge locations each relatively thicker bus strip is suitably reliably selectively electrically externally connected, normally to an equally large solder pad on the top and/or the bottom surfaces of the body, therein permitting reliable external electrically connection to selective ones of the multiple components that are within the body.

This construction realizes advantages. The relatively thinner bus strips—by which electrical interconnection of selected ones of the multiple components that are within the body transpires—(1) conserve room upon the side surfaces of the body. This means that more connections can be made per unit area.

Meanwhile, the relatively thicker bus strips are adequately wide and robust so as to, in particular, both (2a) exhibit superior mechanical resistance to chipping when located, as is preferable, at the edges of the sides of body, while (2b) permitting reliable external electrical connection to themselves, and also to the selected ones of the multiple components to which they are in turn connected, at, in accordance with their increased size, a lower ohmic resistance.

Finally, the wider thicker bus strips mate admirably fully with equally large solder pads that are located on the top and bottom surfaces of the body. These large solder pads, matched to the large bus strips, permit easy, positionally tolerance, high current, low resistance connections.

The present invention may alternatively be considered to be a method of making a patterned electrical traces on a surface of a monolithic ceramic multiple capacitor. In the method a large number of electrically insulating ceramic layers, and of electrically conducting metallization layers, are stacked in a laid-up multi-layer wafer sandwich. The wafer sandwich typically contains the substrates of a great number of ceramic multiple capacitors, typically 800+. The wafer has major top and bottom surfaces. A patterned surface metallization layer is printed, or added, as a topmost (and bottommost) surface. This layer is patterned in a metal—normally gold or a member of the platinum group—that will withstand the 1000° C.+ temperatures of firing. The individual substrates that will become the ceramic multiple capacitors are diced from the wafer only after the printing (adding) of its top (and bottom) surface metal.

Each of the many multi-layer substrates with its patterned top (and bottom) surface metallization layer is then co-fired to produce a monolithic ceramic multiple capacitor having (i) internal electrically-insulating ceramic layers, (ii) internal electrically-conducting metallization layers, and also (iii) one or more integral, patterned, electrically-conductive surface metallization layers (i.e., a top and/or a bottom such layer).

The patterned top, and also the bottom, surface metallization layers are selectively electrically connected to internal electrically-conductive metallization layers within the monolithic ceramic multiple capacitor by metallized traces upon the side surfaces of the multi-layer sandwich. These metallized traces are preferably separated by castellations, as is taught within the predecessor related U.S. Pat. No. 5,367,430.

Therefore, it will be recognized in application of the present invention that a monolithic ceramic multiple capacitor is based on a three-dimensional ceramic body having a length, and exterior side and top surfaces. A typically great number of electrically-conductive parallel layers are disposed in the body and layered along the length thereof. At least some of these layers typically have an edge connection extending to a side surface of the body.

In accordance with one, preferred, embodiment of a monolithic ceramic multiple capacitor in accordance with the present invention, a number of electrically-conductive bus strips or varying widths extend along the side surfaces of the body. These bus strips selectively electrically interconnect the edge connections of the electrically-conductive parallel layers so as to form a plurality of capacitors. The (i) bus strips and the (ii) edge connections jointly form the external electrical connections to the capacitors. These external electrical connections appear, as well as upon the sides of the body, at the edges of the top surface of the body.

In order to use a monolithic ceramic multiple capacitor, it is clearly necessary to electrically connect it. Components were previously commonly electrically connected to monolithic buried-substrate capacitors by the hand soldering of wires to the (i) bus strips and/or (ii) edge connections. These wires were, in accordance with the typically miniature size of a buried-substrate ceramic multiple capacitor, typically very small and fine, typically but a fraction of an inch of 36 gauge wire. Needless to say, this previous soldering operation was tedious, exacting, laborious and expensive.

Particularly in the instance of the previous hand soldering of electrical components by wire to the surface (i) bus strips and/or (ii) edge connections of a monolithic buried-substrate ceramic multiple capacitor, alignment between component and ceramic multiple capacitor was a problem. This was because, among other reasons, the insubstantial area of the edge connections—which are but a "spill-over" of the side surface metallization onto the top and bottom surfaces of the capacitor (as may still particularly be seen in FIGS. 2–7)—did not provide for proper, ample, setting and alignment of component and capacitor by surface tension dynamics occurring in the liquid solder bond between them.

Meanwhile it is known that electrical components—at least of more macroscopic size than is typically a monolithic buried-substrate ceramic multiple capacitor—may be conveniently electrically joined to a common circuit, normally a printed circuit—if not directly to each other—by surface mounting. The surface mounting may transpire use of conductive adhesives, by soldering, or by reflow soldering. Such surface mounting commonly requires precisely located pads of ample size as best suits the particular leads (and leads pattern) to be adhered by soldering. If, and only it, both the sizes and the juxtaposition of, on the one hand, the surface mounting pads, and, on the other hand, the leads of the board or component to be attached, are appropriate, then the board or component may actually be held to the capacitor (and vice versa), and will be "self-centering" during progress of the surface mounting operation.

The present invention is directed, among other purposes, to providing a top and/or a bottom patterned surface on a ceramic multiple capacitor which surface(s) is (are) in both their metallurgy and in their layout fully compliant with the best practices for surface mounting. The patterned surface(s) will particularly permit the close physical and electrical attachment of a microminiature integrated circuit receivers and/or amplifier, particularly as may be used in hearing aids that are inserted in the external acoustic meatus, or ear canal.

2. Specific Embodiments of the Invention

FIG. 1 is a diagrammatic perspective view showing a first embodiment of a monolithic, buried-substrate, ceramic multiple capacitor 20 in accordance with the present invention having variable-width side castellations 28, and/or variable width conductive traces 26, as well as integral conduction traces 24 on its top surface 22. The surface 22 will be referred to for convenience as the "top" of the multiple capacitor 20, although it should be realized that the capacitor 20 has no preferred orientation. The multiple capacitor 20 can be used in any orientation, but the surface 22 is typically the last to be formed, an is often positioned on "top" during post-firing steps such as the cutting of slots, or castellations, 28, as will be explained. The surface 22 contains and displays a number of conductors, or conductive traces, 24.

The conductive traces 24 were previously printed in the surface 22 by a screening process or the like. This was typically performed after the capacitor 20 had been separated from a great number of like capacitors with which it is integrally manufactured in layers, and fired. In accordance with the present invention, the conductive traces 24 are integral with the top surface 22, and are placed in this surface—again by a screening process or the like—before the capacitor 20 is separated from a great number (typically 800+) of like capacitors with which it is integrally manufactured in layers, and before the capacitor 20 is fired to sinter its multiple (typically 30 to 100) layers into a monolith.

The conductive traces 24 are a portion of electrical circuit paths between the plates of multiple capacitors (not shown) buried within the body of capacitor 20. The conductive traces 24 connect to edge regions 26 that are been metallized, typically by dipping the capacitor 20 (after it has been separated by sawing from like capacitors) in conducting ink.

Adjacent edges 26 of the capacitor 20 are separated by shallow saw cuts, resulting in castellations, as taught within the predecessor related U.S. Pat. No. 5,367,430. The saw cuts particularly allow the width of the slots, and the castellations, to be independent of their depth. Accordingly, the stray capacitance between two independent terminals is in part controlled by the two independent variables: the width of the saw cuts and the depth of the saw cuts. The use of saw cuts to make the castellations resulting from the slots 28 permits these slots 28 to be placed closer together than they could be if produced by drilling, and permits the depth of individual cuts to be varied from those of other cuts if desired.

Portions, typically end portions, of some of the conductive traces 24 are positioned and sized to serve as tabs, or pads, 30. The pads 30 are arrayed and sized to connect the pins of one or more other, predetermined, electrical components, typically at least one integrated circuit (IC) (shown in FIGS. 3–7). In accordance with the present invention, such ICs or other components may be surface mounted by reflow soldering, and/or wire bonded including by each of ultrasonic and soldered wire bonding. The capacitor 20 and any physically- and electrically-connected component(s) collectively form a microminiature electronic circuit, such as may particularly be used in a hearing aid, and such as may more particularly be used in a hearing aid that fits within the ear canal. The length and width of such a composite circuit (not shown in FIG. 1, shown in FIG. 6) is typically on the order of 3 to 4 millimeters, and the thickness on the order of 1–2 millimeters. Other applications may call for other sizes both larger and smaller.

Figure 2:
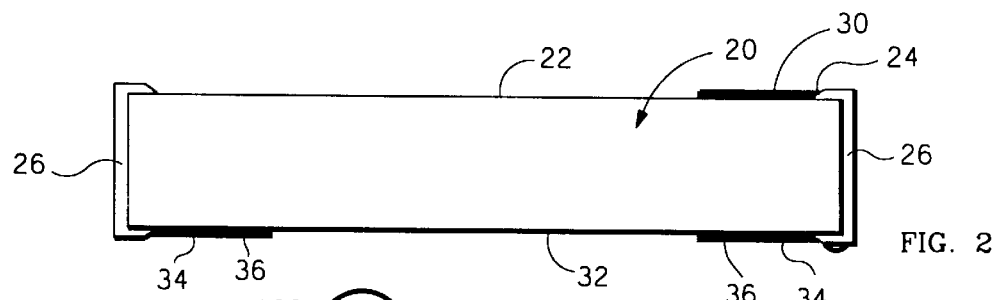
FIG. 2 is a cut-away plan view, taken along perspective line 2—2 shown in FIG. 1, of the first embodiment of the monolithic, buried-substrate, ceramic multiple capacitor in accordance with the present invention having integral conduction traces on its top surface previously seen in FIG. 1, FIG. 2 particularly showing conduction traces, and pads, on a bottom surface of the capacitor.

A cut-away sectional side plan view, taken along perspective line 2—2 shown in FIG. 1, of the same first embodiment of the monolithic, buried-substrate, ceramic multiple capacitor 20 is shown in FIG. 2. FIG. 2 particularly shows the metallized edge regions 26 as are made by dipping the capacitor 20 in conducting ink. These metallized edge regions 26 span over the edges of the top surface 22, and also over the bottom surface 30, to the capacitor 20. Only a short portion of one conductive trace 24, terminating in a pad 30, is shown in cross section to appear upon the top surface 22 at the location of the perspective line 2—2 (shown in FIG. 1). However, and for purposes of illustration, two conductive traces 34, each terminating in a pad 36 are shown, again in cross section, to exists on the bottom surface 32 of the capacitor 20. Clearly either surface 22,32 has independent conductive traces 24,34 and trace-terminating regions, or pads 30,36. Clearly the conductive traces 24,34 and their terminating regions, or pads 30,36, may be of any desired contour and number as suits the connection task at hand. The integral conduction traces 24 on the top surface 22 of the capacitor 20 are themselves connected to the plates of capacitors buried (not shown) in the multiple capacitor 20 by a metallized edge regions 26 on at least two (opposed) side surfaces of the capacitor 20.

Figure 3:
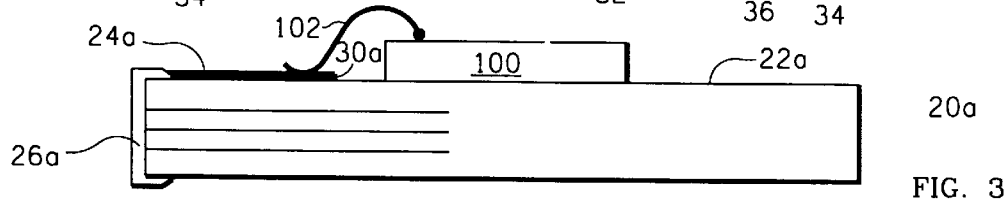
FIG. 3 is a cut-away plan view of a second embodiment of the monolithic, buried-substrate, ceramic multiple capacitor in accordance with the present invention mounting on its top surface an integrated circuit that is wire soldered to integral conduction traces and pads on the top surface of the capacitor.

A cut-away plan view of a second embodiment of a monolithic, buried-substrate, ceramic multiple capacitor 20*a* in accordance with the present invention is shown in FIG. 3. The multiple capacitor 20*a* mounts on its top surface an integrated circuit, or IC, 100 that is wire soldered by wire 102 (both shown in phantom line for not being a part of the present invention) to integral conduction traces 24*a* and pads 30*a* on the top surface 22*a* of the capacitor 20*a*. The integral conduction traces 24*a* on the top surface 22*a* of the capacitor 20*a* are themselves again connected to the plates of capacitors buried (not shown) in the multiple capacitor 20*a*, this time by a single metallized edge region 26*a*.

Figure 4:
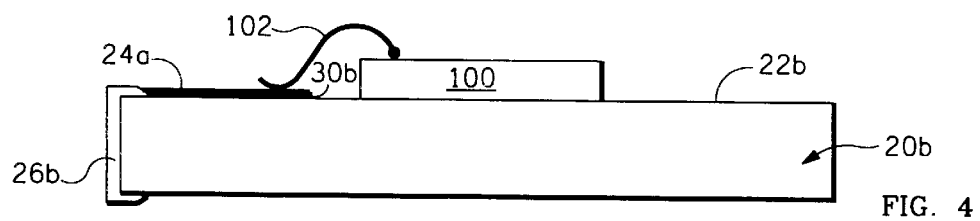
FIG. 4 is a cut-away plan view of a third embodiment of the monolithic, buried-substrate, ceramic multiple capacitor in accordance with the present invention mounting on its top surface an integrated circuit that is reflow soldered over a portion of its area, and that is also wire soldered, to integral conduction traces and pads on the top surface of the capacitor.

A cut-away plan view of a third embodiment of a monolithic, buried-substrate, ceramic multiple capacitor 20*b* in accordance with the present invention is shown in FIG. 4. The multiple capacitor 20*b* mounting on its top surface an integrated circuit IC 100 that is reflow soldered to pads 30*b* upon the top surface 22*b* of the capacitor 20*b* over a portion of its area. and that is also wire soldered, to integral conduction traces and pads on the top surface of the capacitor. The IC 100 is also wire connected—including by ultrasonic boding or soldering—to other pads 30*b* upon the top surface 22*b* of the capacitor 20*b*. It may be noted that the wires 102 can connect to different ones of the pads 30*b* than do the reflow soldered connections, and that the wiring may be quite dense.

Figure 5:
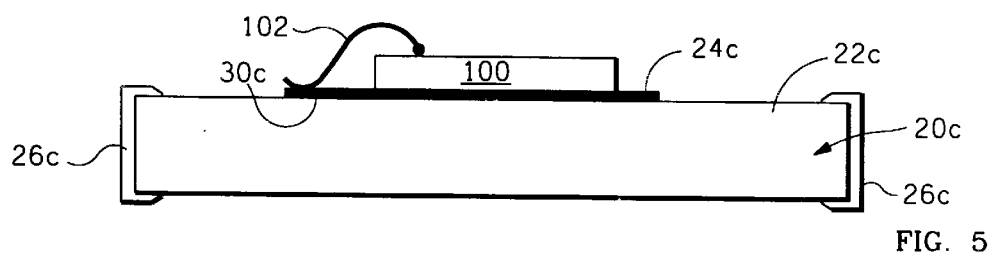
FIG. 5 is a cut-away plan view of a fourth embodiment of the monolithic, buried-substrate, ceramic multiple capacitor in accordance with the present invention mounting on its top surface an integrated circuit that is reflow soldered over all of its area, and that is also wire soldered, to integral conduction traces and pads on the top surface of the capacitor.

A cut-away plan view of a fourth embodiment of a monolithic, buried-substrate, ceramic multiple capacitor 20*c* in accordance with the present invention is shown in FIG. 5. The capacitor 20*c* mounts on its top surface 22*c* an integrated circuit IC 100 that is reflow soldered over all of its area, and that is also wire soldered by wires 102, to integral conduction traces 24*c* and pads 30*c* on the top surface of the capacitor 20*c*.

Figure 6:
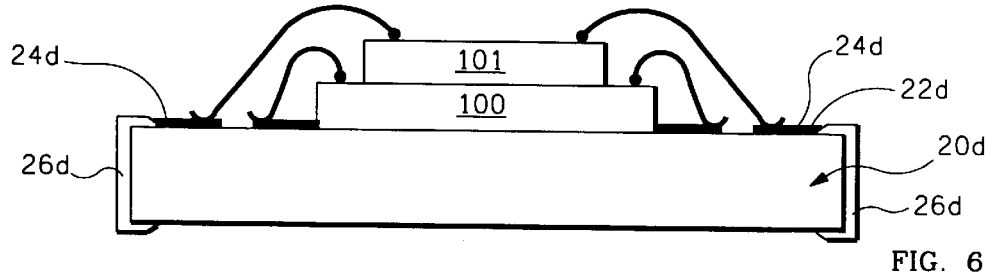
FIG. 6 is a cut-away plan view of a fifth embodiment of the monolithic, buried-substrate, ceramic multiple capacitor in accordance with the present invention mounting on its top surface two components each of which is wire soldered to integral conduction traces and pads on the top surface of the capacitor.

A cut-away plan view of a fifth embodiment of a monolithic, buried-substrate, ceramic multiple capacitor 20*d* in accordance with the present invention is shown in FIG. 6. The capacitor 20*d* mounts on its top surface 22*d* two components 100, 101 each of which is wire soldered to integral conduction traces 24*d* and pads 30*d* on the top surface of the capacitor 20*d*.

Figure 7:
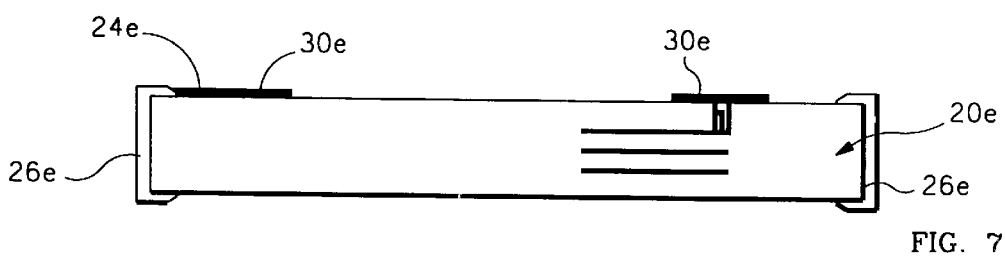
FIG. 7 is a cut-away plan view of a sixth embodiment of the monolithic, buried-substrate, ceramic multiple capacitor in accordance with the present invention wherein an integral conduction trace and pad on the top surface of the capacitor is not electrically connected through metallization on side surfaces of the capacitor, as in previous embodiments, but is instead directly electrically connected to lower electrically-conducting, metallization, layers within the capacitor.

A cut-away plan view of a sixth embodiment of a monolithic, buried-substrate, ceramic multiple capacitor 20*e* in accordance with the present invention is shown in FIG. 7. In this embodiment one integral conduction trace 24*e* and one pad 30*e* on the top surface of the capacitor electrically connects through metallization 26*e* on a side surfaces of the capacitor 20*e*. However, another one of the pads 30*e* does not electrically connect though any side metallization 26–26*e*, as in previous embodiments 20–20*d*, but is instead directly electrically connected to lower electrically-conducting, metallization, layers within the capacitor—illustrated in cut-away view—by several continuous, buried, patterned metal layers.

All the various embodiments 20–20*e* have an present an integral, patterned electrically-conductive top surface layer 20–20*e*. It is at and through this integral top layer 20–20*e* that external electrical connections are selectively made to each of multiple capacitors. These electrical connections are commonly, but not invariably nor necessarily, through reflow pads to which reflow pads the electrical components may suitably be surface mounted.

In accordance with the preceding explanation, variations and adaptations of the monolithic, buried-substrate, multiple capacitors with integral conduction traces on selected surfaces in accordance with the present invention will suggest themselves to a practitioner of the electrical component design arts. For example, a multi-tier tower of many (integrated) circuits and multiple capacitors is possible. For example, multiple components could be solder bonded to each, or both, surfaces, and even a side or two, of a single multiple capacitor—making the multiple capacitor assume the role of a three-dimensional printed circuit board.

In accordance with these and other possible variations and adaptations of the present invention, the scope of the invention should be determined in accordance with the following claims, only, and not solely in accordance with that embodiment within which the invention has been taught.

What is claimed is:

1. A monolithic multiple electronic component comprising: a three-dimensional body having a length, and exterior side and top surfaces; a multiplicity of electronic components disposed within the body; a multiplicity of electrically-conductive traces disposed within the body on layers along the length of the body, the multiplicity of traces electrically connecting to the multiplicity of electronic components within the body, at least some of the multiplicity of traces that are upon at least some of the layers extending to present connectable trace-edges at at least one of the side surfaces of the body; a plurality of electrically-conductive bus strips of at least two widths, some relatively thinner and some relatively thicker, wherein the relatively thinner bus strips extend along at least one of the side surfaces of the body so as to selectively electrically interconnect selected connectable trace-edges to selected other connectable trace-edges, therein internally electrically interconnecting selected ones of the multiplicity of components, and wherein the relatively thicker bus strips extend along at least one of the side surfaces of the body from selected connectable trace-edges to, and so far as to, an edge of at least one of the top and boetom surfaces of the body, where at said edge the relatively thicker bus strip is able to be reliably electrically externally connected, therein permitting reliable external electrical connection to selective ones of the multiplicity of components that are within the body; wherein the relatively thinner bus strips conserve room upon the at least one side surface for electrically interconnecting many selected ones of the multiplicity of components; and wherein the relatively thicker bus strips permit of reliable external electrical connection to the thicker bus strips themselves, and to the selected ones of the multiplicity of components to which the thicker bus strips are connected.

2. The monolithic multiple electronic component according to claim 1 further comprising: a patterned electrically-conductive layer upon at least one of the top and the bottom surfaces of the body, the patterning of the patterned electrically-conductive layer serving to selectively electrically connect strip-edges of the relatively thicker bus strips appearing at the at least one of the top and bottom surfaces of the body to reflow solder pads upon the at least one of the top and bottom surfaces of the body.

3. The monolithic multiple electronic component according to claim 2 adapted and configured as a ceramic multiple capacitor wherein the three-dimensional body comprises:
    ceramics;
    wherein the multiplicity of electronic components disposed within the body comprise:
        a multiplicity of capacitors having electrically-conductive parallel layers disposed in the body and layered along the length thereof;
        wherein the relatively thinner bus strips extending along at least one side surface of the body selectively electrically interconnect ones of the multiplicity of electrically-conductive parallel layers so as to form the multiplicity of capacitors; and
        wherein the relatively thicker bus strips extending along at least one side surface of the body electrically connect to the capacitors.

4. The monolithic ceramic multiple capacitor according to claim 3 further comprising: a patterned electrically conductive top surface layer integral to the body, the patterning of said integral top surface layer serving to selectively electrically connect external electrical connections appearing at the edges of the top surface of the body, and the plurality of capacitors to which the external electrical connections electrically connect to reflow solder pads upon the top surface of the body; wherein the patterned electrically-conductive top surface layer is integrally in corporated into the three-dimensional ceramic body at the same time as are the plurality of electrically-conductive parallel layers in the body, the top surface layer itself being an uppermost, outwardly-disposed and -exposed, particularly patterned, electrically conductive layer; wherein the electrically-conductive top surface layer is fully as integral to the three-dimensional ceramic body as are the plurality of electrically-conductive parallel layers in the ceramic body.

5. The monolithic ceramic multiple capacitor according to claim 4 further comprising:
    a patterned electrically-conductive bottom surface layer also integral to the body, the patterning of integral bottom surface layer serving to selectively electrically connect the external electrical connections appearing at the edges of the top surface of the body, and the plurality of capacitors to which the external electrical connections electrically connect; to reflow solder pads upon the bottom surface of the body;
    wherein the patterned electrically-conductive bottom surface layer is integrally incorporated into the three-dimensional ceramic body at the same time as are the plurality of electrically-conductive parallel layers in the body and as is the top surface layer, the bottom surface layer itself being an uppermost, outwardly-disposed and -exposed, particularly patterned, electrically conductive layer;
    wherein the electrically-conductive bottom surface layer is fully as integral to the three-dimensional ceramic body as are the plurality of electrically-conductive parallel layers in, the integral top surface layer in the ceramic body.

6. The monolithic multiple electronic component according to claim 1 wherein the plurality of electrically-conductive bus strips comprise:
    castellations of at least two, a relatively thinner and a relatively thicker, widths.

7. A monolithic multiple capacitor comprising:
    a ceramic body having a length, and side, top and bottom surfaces;
    a plurality of electrically conductive parallel layers disposed in said body and layered along said length, each conductive layer having a trace extending to a side surface of said ceramic body;
    a plurality of metallized bus strips of at least two widths, some relatively thinner and some relatively thicker, extending along at least one side surface of said ceramic body, the relatively thinner bus strips selectively interconnecting some traces as extending to the at least one side surface to each other in order to form a plurality of capacitors; the relatively thicker bus strips selectively extending some traces as extending to the at least one side surface to an edge of at least one of the top and bottom surfaces of the body, where at an edge of the at least one of the top and bottom surfaces, the plurality of relatively thicker bus strips are suitably reflow soldered to form a plurality of external connections; and a plurality of saw-cut slots disposed in the body at at least two different intervals so as to create and define the plurality of metallized bus strips having the at least two widths.

8. The monolithic multiple capacitor according to claim 7 wherein the plurality of saw-cut slots are rectangular in cross-section with a depth and a width, the depth of at least one of the rectangular saw-cut slots being greater than the width thereof thereby to allow selective reduction of parasitic capacitance between adjacent external connections.

* * * * *